United States Patent [19]
Takada

[11] 4,330,859
[45] May 18, 1982

[54] AUTOMATIC GAIN CONTROL CIRCUIT IN MULTI-DIRECTION TIME DIVISION MULTIPLEX COMMUNICATION SYSTEM

[75] Inventor: Masami Takada, Tokyo, Japan
[73] Assignee: Nippon Electric Co., Ltd., Tokyo, Japan
[21] Appl. No.: 77,027
[22] Filed: Sep. 19, 1979
[30] Foreign Application Priority Data
  Sep. 25, 1978 [JP] Japan ............................. 53-116498
[51] Int. Cl.³ ........................................ H02K 47/04
[52] U.S. Cl. .................................. 370/113; 370/97; 370/77
[58] Field of Search ...................... 375/4, 102; 455/10, 455/11, 12, 246, 247; 370/112, 113, 81, 74, 104, 79, 97, 77

[56] References Cited
U.S. PATENT DOCUMENTS

| | | | |
|---|---|---|---|
| 3,400,223 | 9/1968 | Peorotti | 370/112 |
| 3,423,682 | 1/1969 | Cauchois | 375/102 |
| 3,495,244 | 2/1970 | LaRosa | 455/246 |
| 3,649,766 | 3/1972 | LaMarche | 370/81 |
| 4,009,350 | 2/1977 | Cabet | 370/74 |
| 4,121,055 | 10/1978 | Doherty | 370/113 |

Primary Examiner—Douglas W. Olms
Attorney, Agent, or Firm—Laff, Whitesel, Conte & Saret

[57] ABSTRACT

The invention is primarily—although not exclusively—directed to an earth-to-satellite communication system using time division multiplex over a common frequency. An automatic gain control circuit in a receiver unit of the ground or central station receives burst signals transmitted in time slots individually assigned to a plurality of satellite stations. The satellite stations are dispersed in multiple directions, which means that the burst signals which they transmit are not received by the central station with the same amplitude. The inventive automatic gain control circuit causes all of the burst signals to achieve a uniform amplitude within the central station. First, the receiver separates and feeds back the various burst signals into a plurality of individually associated branches. Equipment in the separate branches amplifies the individual feedback signals, using low band-pass amplifiers, and then compounds them into a single gain control signal. These control signals adjust the gains of the individual burst signals. The advantage is that the gain may stabilize on individual time slot pulses without a destabilizing effect from grossly different amplitudes of pulses received during intermediate time slots.

4 Claims, 11 Drawing Figures

SIGNAL RECEIVED AT CENTRAL STATION

AUTOMATIC GAIN
CONTROL CIRCUIT

AUTOMATIC GAIN CONTROL CIRCUIT IN MULTI-DIRECTION TIME DIVISION MULTIPLEX COMMUNICATION SYSTEM

Reference is made to my copending U.S. Pat. application Ser. No. 46,055, filed June 6, 1979, entitled "Multi-Directional Time Division Multiplex Communication System," and assigned to the assignee of this invention.

This invention relates to an automatic gain control circuit in a multi-direction communication system by which communication is achieved between one central station and each of a plurality of satellite stations, and more particularly to an automatic gain control circuits in a digital multi-direction time division multiplex (MD-TDM) communication system.

In this MD-TDM system, a plurality of satellite stations transmit burst signals in time domains assigned to each station. A central station receives each burst signal from the satellite stations, which share the different time intervals on a common frequency. Although this is an effective system having a high frequency-utilization efficiency, it embodies no effective provision against fading. The levels of signals received by the central station vary from one satellite station to another station when fading occurs. Thus, since the drop in reception level, due to fading, varies with the condition of the transmission path between the central station and a given satellite station, the signal received at the central station has an amplitude fluctuation, which requires compensation.

In prior art systems, this compensation is achieved with either a limiter or an ordinary automatic gain control (AGC) circuit.

When the amplitude fluctuation is below a certain level, the limiter can provide an effective means of compensation, but beyond that level the limiter can no longer adequately compensate for the fluctuation. On the other hand, the ordinary AGC circuit is free from the problems of the limiter but, when used in an MD-TDM communication system, of the AGC signal amplifier must be accelerated, with a corresponding increase in the frequency band width of the amplifier. This means that the frequency band width of the AGC signal amplifier and that of the intermediate frequency (IF) amplifier on the main signal path inevitably come close to each other. The IF amplifier has a high gain, in the order of tens of decibels to 100 decibels or even higher. These factors make it difficult to separate the actions of the IF amplifier from the AGC signal amplifier. As a result, undesired noise may occur in the output of the IF amplifier. Also, the transmission characteristic of the IF amplifier may be degraded or the quantity of information (i.e., the number of bits) in the time domain of each satellite station in an MD-TDM system may decrease.

Thus, an object of the present invention is to provide an automatic gain control circuit in an MD-TDM communication system. Another object is to separately apply automatic gain control to each burst signal which is repeatedly transmitted from each satellite station, so that the shortcomings of limiters and conventional AGC circuits can be obviated.

In accordance with this invention, an automatic gain control circuit is in the receiver unit of a first station of a time division multiplex communication system. A plurality of second stations are dispersed in multiple directions and transmit burst signals to the first station. The first station has a first amplifier, which is responsive to a gain control signal, for amplifying, to a predetermined level, each input burst signal transmitted from the plurality of second stations. The output of the first amplifier is branched for every burst signal and for detecting the level of each branched signal. A plurality of other amplifiers amplify each of the ouputs fof the level detecting means to produce a gain control signal corresponding to each burst signal. These gain control signals are supplied to the first amplifier. The output of each of the plurality of amplifiers corresponds to the time interval domain of each burst signal as received by the first amplifier.

Other features of the invention will be apparent from the following description taken in conjunction with the accompanying drawings, in which:

FIG. 1 illustrates an MD-TDM system pertaining to this invention;

FIG. 2 (a) through (f) illustrate examples of signal arrangements transmitted from the satellite stations to the central station in FIG. 1;

Figure 5:
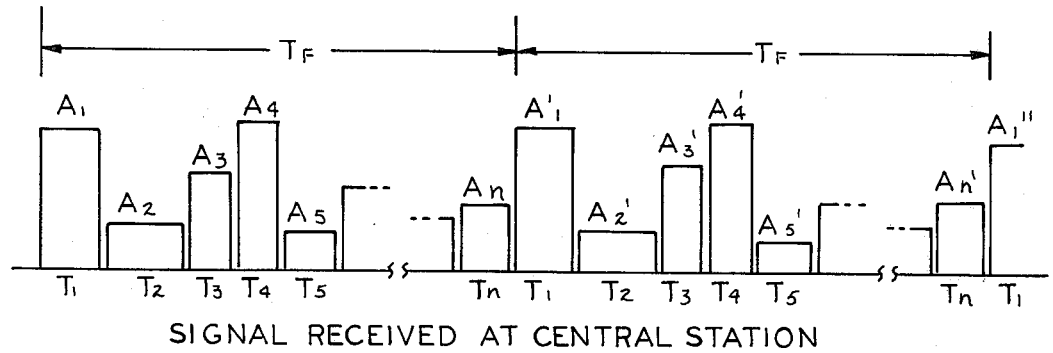
Figure 6:
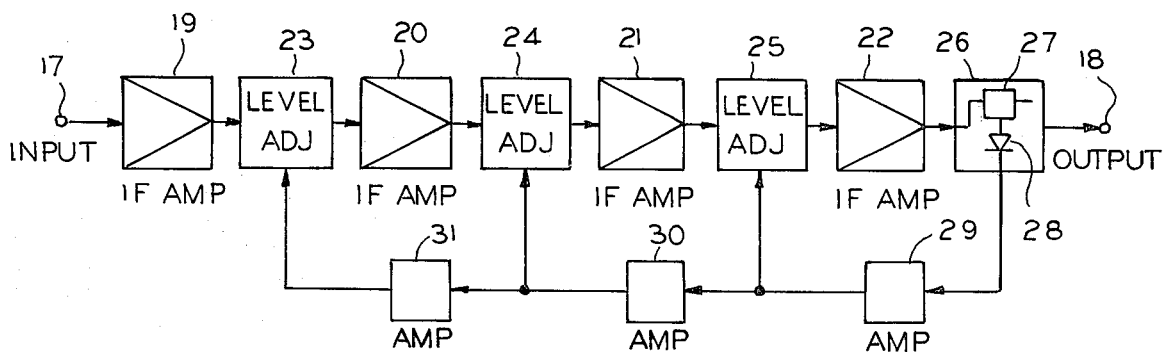
Figure 7:
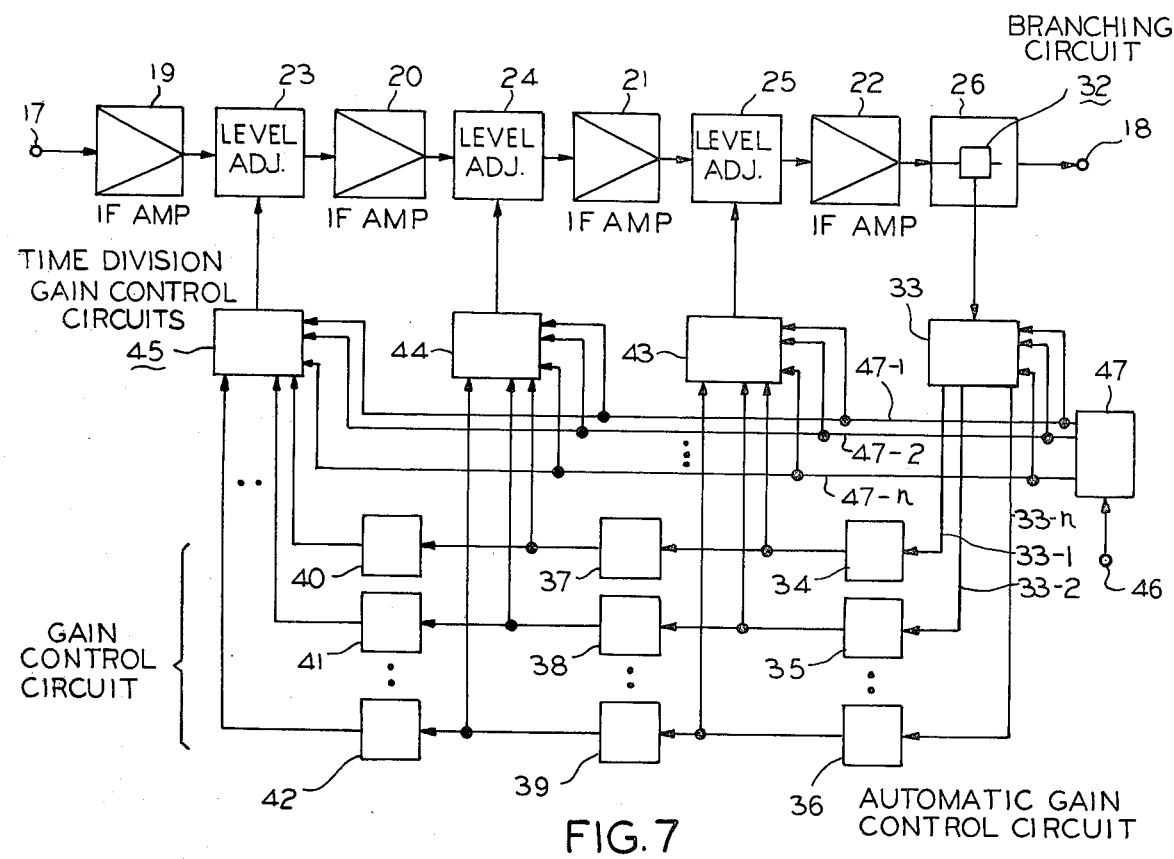
Figure 8:
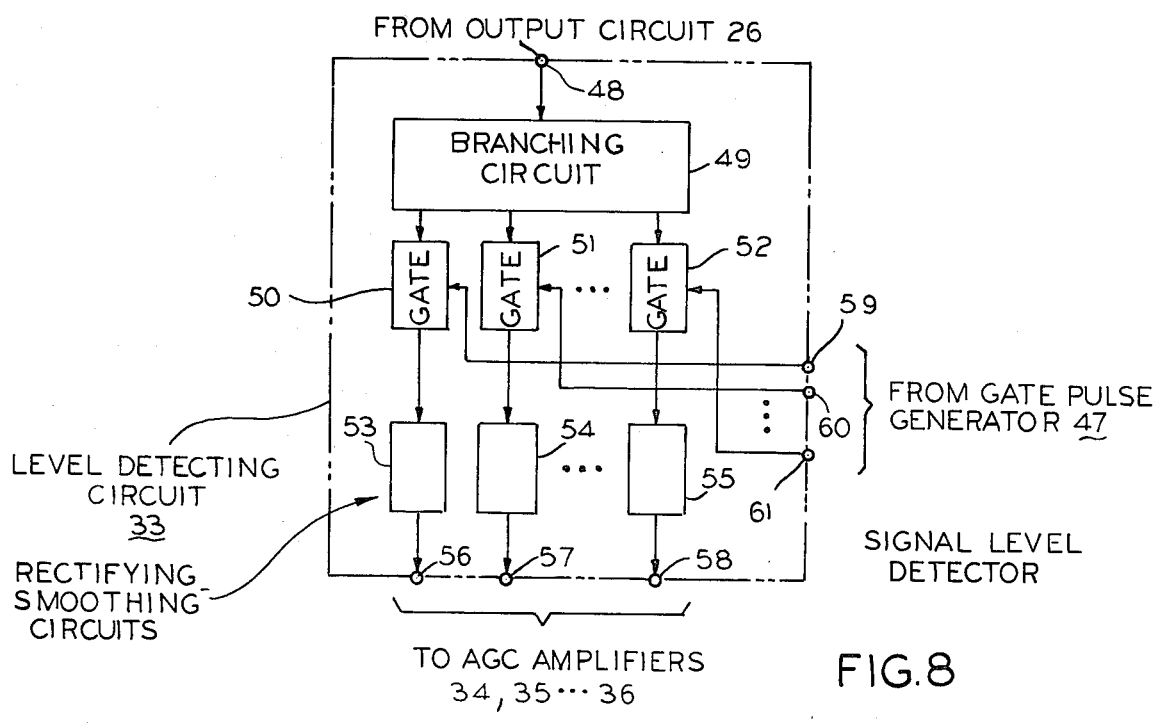
Figure 9:
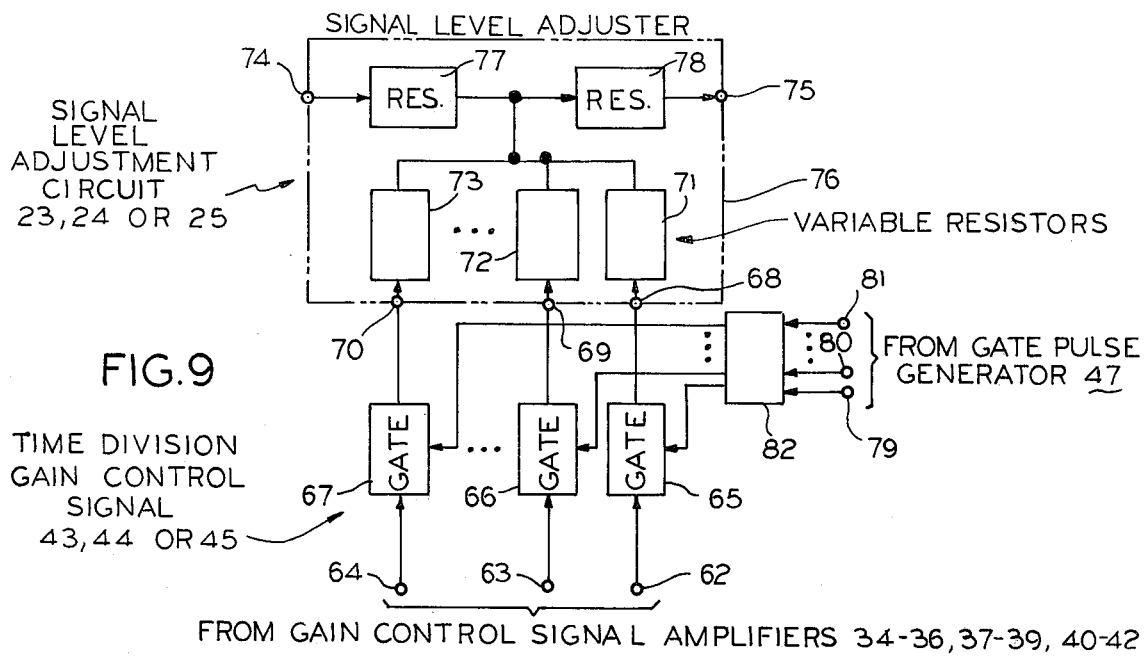
Figure 10:
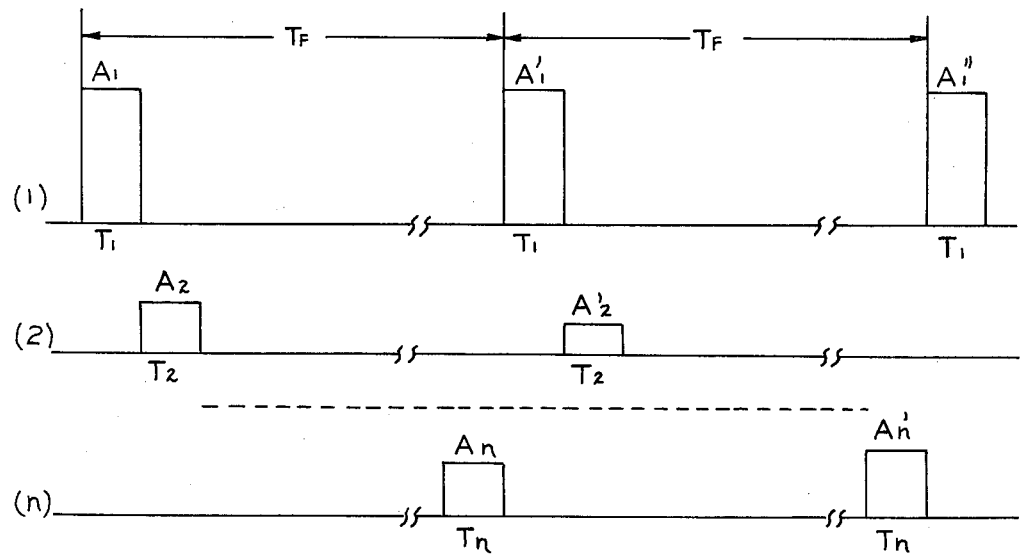
Figure 11:
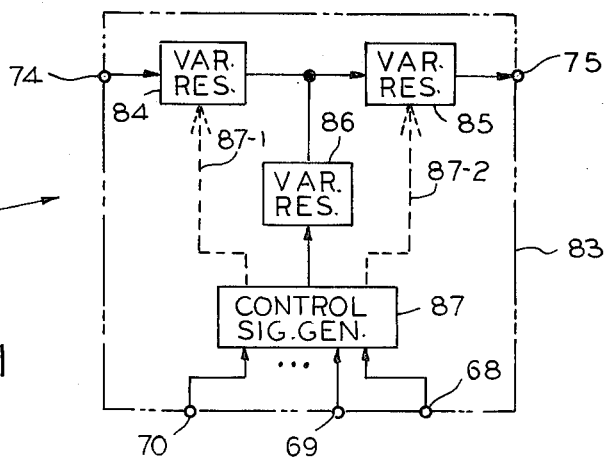

FIG. 5 showns an arrangement of cyclically-recalling signals received by the central station with varying levels or amplitudes;

FIG. 6 illustrates a schematic block diagram of the automatic gain control circuit of the central station in prior art;

FIG. 7 illustrates a schematic block diagram of an automatic gain control circuit in accordance with this invention;

FIG. 8 shows a block diagram of the time division signal level detecting circuit in FIG. 7;

FIG. 9 shows a block diagram of the time division gain control signal compounding circuit in FIG. 7;

FIG. 10 (l) through (n) illustrate the principle of this invention by indicating the level variations of and the time relationship between the burst signals; and FIG. 11 shows another block diagram of the time division gain control signal compounding circuit in FIG. 7.

Figure 1:
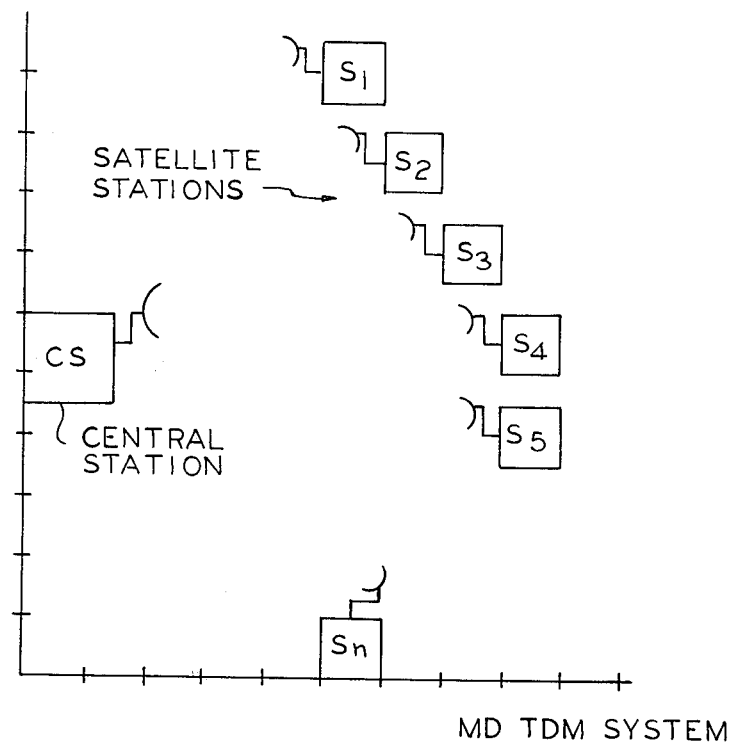

FIG. 1 illustrates a radio digital communication system in which communication is achieved between one central station CS and a plurality of satellite stations $S_1$, $S_2$, ..., $S_n$. The central station CS transmits time division multiplexed (TDM) signals. Each of the satellite stations $S_1$, $S_2$, ..., $S_n$ detects a synchronizing signal contained in the transmitted wave of the central station CS. Using this signal as a reference for synchronization of TDM signals, each of the satellite stations selects only its own channel sent in a pre-allocated time position.

Therefore, the central station CS is able to accomplish time division transmission of signals to a plurality of satellite stations $S_1$, $S_2$, ..., $S_n$ with a single radio unit with transmission over the same frequency range. Communication from the satellite stations to the central station takes place in an inverse sequence as compared to the sequence of transmission from the central station to the satellite stations. Since the satellite stations are geographically dispersed and use a common radio frequency for transmission to the central station, each of them intermittently transmits signals only during the time positions allocated to it in advance.

Figure 2:
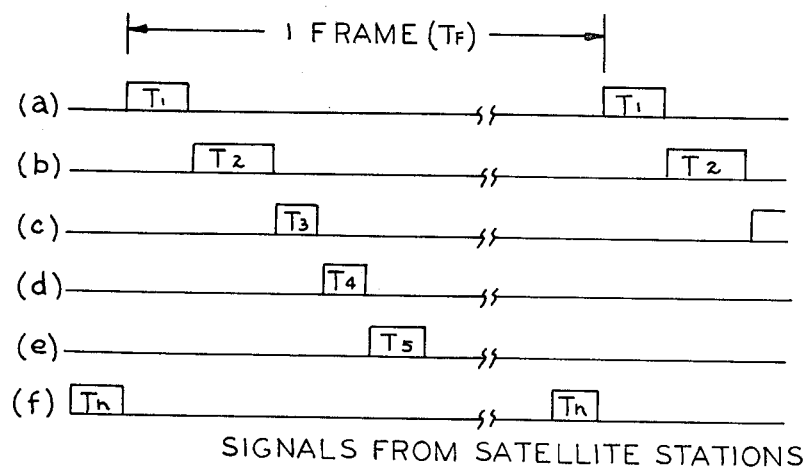
Figure 3:
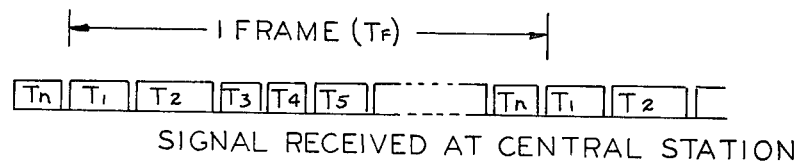
FIG. 3 illustrates an example of arrangement of signals received by the receiver unit of the central station in FIG. 1.

Although the outputs of the satellite stations are burst signals, as illustrated in FIG. 2 (a) through (f), the signals received by the central station as illustrated in FIG. 3, are aligned on the same time axis as if they were a transmitted wave from a single station. This synchronization on the time axis is set, responsive to a synchronizing signal from the central station as reference, on the basis of the time of transmission from each satellite station and the differences in propagation time between the central and satellite stations. For further details of the system illustrated in FIG. 1, refer to my copending application, mentioned above.

Figure 4:
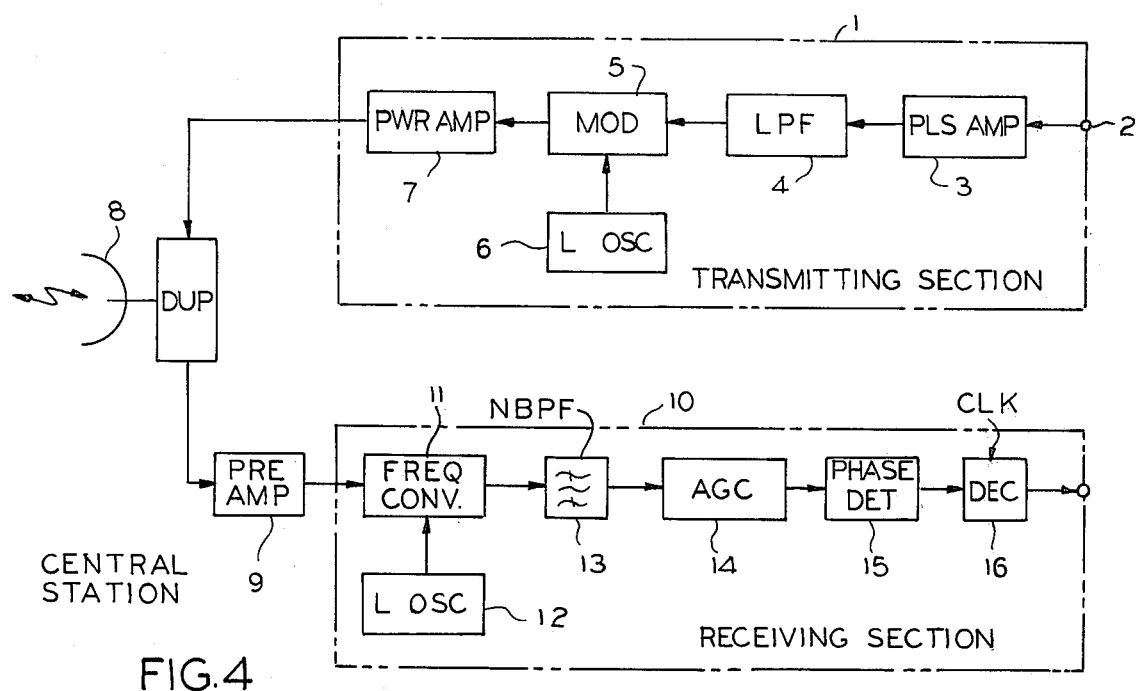
FIG. 4 shows a block diagram of the central station in FIG. 1.

FIG. 4 shows a block diagram of the transmitter-receiver set of the central station. A digitally processed information signal is fed to an input terminal 2 of a transmitting section 1. The signal is shaped and amplified by a pulse amplifier 3, and then spectral shaped by a low-pass filter (LPF) 4. The output of the LPF 4 directly phase-modulates, in a modulator circuit 5, the output signal of a local oscillator 6 in N phases (N is a natural number). The resultant output is amplified by a power amplifier 7, and transmitted to the satellite stations from a wide-beam antenna 8.

Signals from the satellite stations are received by the antenna 8 and amplified by a low-noise preamplifier 9 having a favorable noise figure, and then enter into a receiving section 10. After being frequency-converted by a frequency converter 11, using the oscillating output of a local oscillator 12, noise and interference in the signals are suppressed by a narrow band pass filter 13.

Although signals from the satellite stations are aligned in the time domain as illustrated in FIG. 3, their reception levels vary from station to station owing to fading. Exemplary amplitude fluctuations are illustrated in FIG. 5, where "$A_1$" indicates signals received from satellite station 1, "$A_2$" indicates signals received from satellite station 2, etc. Signals having these amplitude fluctuations may be equalized in amplitude by varying the overall gain of the receiver amplifier circuitry through the use of an automatic gain control (AGC) circuit 14. The output of the AGC circuit 14 is demodulated by a phase detector 15. Then, the demodulated output is sampled in a decision circuit 16 responsive to a clock signal synchronized with a transmitted signal supplied from a transmission digital processing section (not illustrated). The resulting sample is fed to a reception digital processing section (not illustrated).

In FIG. 5, $T_F$ represents the frame time during which a plurality or signals are received, one from each satellite station. The received signals from each satellite station recur cyclically during individually associated time slots. The signals $A_1, A_2, \ldots, A_n$ represent the amplitudes of the corresponding burst signals transmitted from the satellite stations, as received by the receiving section 10. The received signals shown in FIG. 5, as stated above, are equalized in amplitude by the AGC circuit 14 in FIG. 4. An example of this conventional AGC circuit is illustrated in FIG. 6, in which reference numerals 17 and 18 respectively represent the input and output terminals of a series of IF amplifiers 19, 20, 21 and 22, separated by level adjusters, 23, 24 and 25, each consisting of two fixed resistors and one variable resistor (diode). Circuits 19-26 form a plurality of cascaded stages extending from input terminal 12 to output terminal 18. Circuit 26, which performs output coupling and level detection, has an output branching circuit 27, and a level detector-rectifier 28. Gain control signal amplifiers 29, 30 and 31 feed the output of the level detector 28 to the level adjusters 23, 24 and 25. The level adjusters 23, 24 and 25 control the outputs of the IF amplifiers 19, 20, 21 and 22 so that the outputs at the output terminal 18 are maintained at a prescribed standard level.

The response speed of the feedback section containing the rectifier 28 and amplifiers 29, 30 and 31 is a range of zero to 1 kHz corresponding to the fading variation speed rate. Two fixed resistors in each of the level adjusters 23, 24 and 25 may preferably be a type of diode which is a variable resistor. Although the AGC circuit illustrated in FIG. 6 has separate amplifiers and level adjusters, in many other instances level adjusters are built into IF amplifiers 19, 20, 21 and 22. In these instances, the direct current of the emitter of a transistorized amplifier circuit, or a base circuit, or the local feedback of the high frequency current is controlled to adjust the gain of the IF amplifier. However, all these AGC circuits act and function in the same way. While the example of FIG. 6 has separate amplifiers and adjusters, that is not important insofar as the description of the present invention is concerned.

Time interval signals $T_1, T_2, T_3, \ldots, T_n$ in FIG. 5 are modulated by the digital signal of the information to be transmitted, which may be composed of many different symbol time lengths. When signals $T_2$ and $T_5$ experience Rayleigh fading, there is a substantial level difference between $A_1$ and $A_2$ or between $A_4$ and $A_5$. In such a case, it is difficult for amplifiers with conventional AGC circuits, as illustrated in FIG. 6, to faithfully accomplish gain control response to variations in the reception input level points between signals $T_1$ and $T_2$, between signals $T_2$ and $T_3$, between signals $T_4$ and $T_5$, between signals $T_5$ and $T_6$, on account of the transient phenomena of the AGC feedback sections of the rectifier 28, and amplifiers 29, 30 and 31. In order that the signals received during time intervals $T_1, T_2, \ldots, T_n$ are accurately amplified so that the demodulator can achieve error-free demodulation, the AGC feedback sections and the gain adjusting sections of the amplifiers 23, 24 and 25 should be able to respond to variations in input reception levels within a period of time which is not longer than about a quarter of the symbol time interval. This means that the frequency band pass of the gain control signal amplifiers 29, 30 and 31 should be very wide, or about as wide as the reciprocal of a quarter of the symbol time interval. When, as is the usual practice, commonly known intermediate frequency amplifiers are used as received signal amplifiers 19, 20, 21 and 22 in FIG. 6, the band widths of the intermediate frequency amplifiers and the gain control signal amplifiers 29, 30 and 31 come close to each other. Since intermediate frequency amplifiers for received signals have high gains ranging from tens of decibels to hundreds of decibels or even higher, it is hardly possible to completely separate the actions of these two sets of amplifiers from each other. As stated above, the output signals of the AGC circuits are accordingly adversely affected.

FIG. 7 illustrates the construction of one embodiment of the circuitry which achieves time division of the automatic gain control signals in accordance with this invention. In the figure, level adjust circuits and amplifies 17 through 26 perform, respectively, the same functions as the components represented by the corresponding reference numerals in FIG. 6 and an output branching circuit 32 is provided for level detection. Time division signal level detecting circuit 33 separately picks out, rectifies and smoothes the time signals $T_1, T_2, T_3, \ldots, T_n$ of the received signals illustrated in FIG. 5 to make burst output level signals. Each of the circuits 33-42 is a gain control amplifier.

The outputs of the time division detector circuit 33 are directed to transmission lines 33-1, 33-2, ..., 33-n, which feed the gain control signal amplifiers 34, 35, ..., 36. The output of the amplifier 34 is amplified by the amplifier 37, whose output is amplified by the amplifier 40. Similarly, the output of the amplifier 35 is amplified by the amplifier 38, and that of the amplifier 38 by the amplifier 41. The output of the amplifier 36 is amplified by the amplifier 39, and that of the amplifier 39 by the amplifier 42.

Reference numerals 43, 44 and 45 represent time division gain control signal compounding or arranging circuits. Their inputs are taken from the outputs of the amplifiers 34, 35, ..., 36 and 37, 38, ..., 39 and 40, 41, ..., 42 respectively. These amplifiers have detected and amplified the time signal levels $T_1$, $T_2$, $T_3$, ..., $T_n$. Circuits 43, 44, 45 gate these inputs to adjust the reception levels in the burst signal durations of signals $T_1$, $T_2$, $T_3$, ..., $T_n$ as they pass through the gain adjusters 25, 24 and 23.

The gain control signal amplifiers 34, 37 and 40 control the gains of the reception amplifiers with respect to the reception level $A_1$ in the time period of signal $T_1$, which, effecting low frequency amplification in a very narrow frequency band, usually amplify a frequency range of 1 KHz or below, like amplifiers used for reception of ordinary continuous signals. Similarly, the groups of the gain control signal amplifiers 35, 38 and 41, and 36, 39 and 42 control the gains of the reception amplifiers with respect to level $A_2$ in period $T_2$ and level $A_n$ in period $T_n$, respectively. Since these detected level amplifiers have operational frequency ranges which are different from those of the IF signal amplifiers 19, 20, 21 and 22, the two sets of amplifiers can be readily allowed to independently act with no mutual interference at all.

A timing signal is fed to an input terminal 46. This timing signal is obtained by time-adjusting the clock signal used for sampling purposes, as seen in the demodulation circuitry of FIG. 4. Or, timing may be derived from the timing or frame synchronizing signal used when an information signal is separated after the regeneration timing signal or demodulated digital signal has been fed to the receiving section of the multiplex terminal equipment of the information signal.

Reference numeral 47 (FIG. 7) represents a circuit which generates gate pulses corresponding to time periods $T_1$, $T_2$, $T_3$, ..., $T_n$ of the received signals. The circuit 47 supplies gate pulses to the time division signal level detecting circuit 33 and to time division gain control compounding or arranging circuits 43, 44 and 45, through transmission lines 47-1, 47-2, ..., 47-n.

FIG. 8 illustrates a specific embodiment of the time division signal level detecting circuit 33 shown in FIG. 7. To an input terminal 48 is supplied a time division multiplex signal obtained from the branching circuit 32. Reference numeral 49 represents a branching circuit giving as many outputs as there are time division subframes of $T_1$, $T_2$, ..., $T_n$. The branched outputs are fed to gate circuits 50, 51, ..., 52. Output signals of the gate pulse generator 47 are also fed to the gate circuits 50, 51, ..., 52. These gate circuits 50-52 gate and pick out individual time segments needed for level detection in the time domains of $T_1$, $T_2$, $T_3$, ..., $T_n$ of FIG. 5, and feed the timing signals to respectively corresponding rectifying-smoothing circuits 53, 54, ..., 55. The outputs of circuits 53, 54, ..., 55, as seen at output terminals 56, 57, ..., 58, are smoothed currents having levels corresponding generally to the individual levels of signals $A_1$, $A_2$, ..., $A_n$ in FIG. 5. To terminals 59, 60, ..., 61 are supplied the output signals of the gate pulse generator 47. These gate signals are fed to the proper gate circuits 50, 51, ..., 52, in order to gate the circuits during the time segments $T_1$, $T_2$, $T_3$, ..., $T_n$ to feed the proper AGC amplifier. In this manner, burst gain control signals are obtained.

FIG. 9 illustrates an embodiment of the circuit construction used for the time division gain control signal compounding or arranging circuits 43, 44 and 45 of FIG. 7. FIG. 9 also includes the part corresponding to the signal level adjuster 23, 24 or 25. The output signals of the amplifiers 34, 35, ..., 36 or 37, 38, ..., 39 or 40, 41, ..., 42 in FIG. 7 are supplied to terminals 62, 63, ..., 64. These signals vary with the level fluctuations indicated by the symbols $A_1$, $A_2$, $A_3$, ..., $A_n$ of FIG. 5. Their frequency band widths must accommodate the frequency components of the level fluctuations. Components represented by reference numerals 65, 66, ..., 67 constitute gate circuits. Numerals 71, 72, ..., 73 identify variable resistors which, in this embodiment, are part of the compounding circuits 43, 44 and 45 and part of the signal level adjusters 23, 24 and 25 (FIGS. 6, 7). Numerals 74 and 75 respectively identify the input and output terminals of the signal level adjusting circuits 23, 24 or 25. Components identified by numerals 71 through 73 constitute a signal level adjuster 76. The numerals 77 and 78 identify variable, or in some cases fixed, resistor circuits. To terminals 79, 80, ..., 81 are fed the gate pulses generated at the gate pulse generator 47. An adjusting circuit 82 matches the gate times of the gate circuits 65, 66, ..., 67 within the periods $T_1$, $T_2$, ..., $T_n$ of the time division signals passing from the terminal 74 to the terminal 75.

FIG. 10 illustrates the level fluctuations over time of burst signals transmitted in the individual time domains $T_1$, $T_2$, $T_3$, ..., $T_n$. The description of FIG. 9 will be continued hereinafter with reference to FIG. 10, as well, when required. A control signal which varies along the envelope of the amplitudes $A_1$, $A_1'$, $A_1''$, ... of the transmission signal received in the time domain $T_1$ is supplied to the gate circuit 65, by way of the terminal 62. The gate circuit 65 is controlled by the gate pulse of $T_1$ fed to the terminal 79. Circuit 65 gates a control signal supplied in a time relationship exactly matching the time position and time width of period $T_1$ of the transmitted signal which is fed to the terminal 74. Circuit 65 supplies such a control signal, as is illustrated in FIG. 10 (1) to the variable resistor 71, via the terminal 68. The signal level adjuster 76 controls the signal fed to the terminal 75 in inverse proportion to the magnitudes of the amplitudes $A_1$, $A_1'$ and $A_1''$ of FIG. 10 (1). Thus, the gain of the receiver is reduced as the amplitude $A_1$ increases, and the gain is increased as the amplitude $A_1$ decreases. To the gate circuit 66, by way of the terminal 63, is supplied a control signal, which varies with the envelope $A_2$, $A_2'$, ... illustrated in FIG. 10 (2). The gate circuit 66, which is actuated by the gate signal of time period $T_2$ fed to the terminal 80, gives such a control signal, as is illustrated in FIG. 10 (2), to its output terminal 69. This signal controls the variable resistor 72 to supply the terminal 75 with a transmitted signal having a level which has an amplitude with an inverse proportion to amplitudes $A_2$, $A_2'$, ..., exactly for a duration of time period $T_2$, but no longer. Further to the gate circuit 67, by way of the terminal 64, is supplied a control signal which varies with the envelope of $A_n, A_n', \ldots$ illustrated in FIG. 10 (n). A gate signal of time $T_n$, fed to the terminal 81, controls the gate circuit 67 so that a control signal is given to the variable resistor 73 for exactly the duration of time period $T_n$, but no longer. The terminal 75 is fed with a transmitted signal having a level which is in inversely proportion to amplitudes $A_n, A_n', \ldots$, but only for the exact duration of period $T_n$. In the manner heretofore described, the width of amplitude fluctuations of the transmitted signals received by the terminal 74, as illustrated in FIG. 5, is compressed, and the signals so processed are supplied to the terminal 75.

FIG. 11 illustrates another embodiment of the signal level adjuster to compound time division gain control signals and to control gains. A signal level adjuster 83 comprises variable resistors 84, 85 and 86, and a time division level control signal compounding circuit 87, receives transmitted signals through its input terminal 74 and emits them through its output terminal 75. Level control signals, in $T_1, T_2, T_3, \ldots, T_n$, are fed to terminals 68, 69, . . . , 70, compounded in the different time intervals in the compounding circuit 87, and supplies them to the variable resistor 86 to achieve gain control. Resistors 84 and 85 are also variable resistor circuits, operating responsive to control signals from the compounding circuit 87 is represented by broken lines 87-1 and 87-2. In a simple level adjuster fixed resistors may be used as elements 84 and 85.

In accordance with the present invention, as described with reference to FIGS. 7, 8, 9 and 10, the time division signal level detecting circuit 33 detects the receiver output levels of individually transmitted signals to achieve level detection in the different time intervals, at a high speed as illustrated in FIG. 8. The level detecting circuit 33 supplies to the respectively corresponding terminals only the variations over time of the individually transmitted signal levels $A_1, A_2, \ldots, A_n$ in the time domains $T_1, T_2, \ldots, T_n$. The detected level control signals so supplied contain only the frequency components of the level fluctuations of the respectively corresponding transmitted signals, which are very low frequencies relative to the operating frequency range of the IF signal amplifiers 19, 20, . . . , 22. Thus, the frequency response of the gain control signal amplifiers 34, 37, 40 and so on may be limited to these low frequencies.

The time division gain control compounding circuits 43, 44 and 45, as described with reference to FIG. 5, are fast acting circuits which transmit the amplitude variations of signals $A_1, A_2, A_3, \ldots, A_n$ to the level control circuits 23, 24 and 25 in exact response to the burst signal waveforms of the time domains $T_1, T_2, T_3, \ldots, T_n$. Circuits 43, 44, 45 operate in a frequency range up to three to four times the symbol frequency of the transmitted information signals. However, the operational frequency range of the IF signal amplifiers 19 through 22 and of the control signal amplifiers 34 through 42 are sufficiently distant from each other for these two groups of circuits to act fully independently without interfering with each other, even if the gains of the amplifiers are high. In the conventional circuit illustrated in FIG. 6, independent actions are difficult to achieve. As a result, undesired noise may occur on the output signal of the IF signal amplifiers. Also, the transmission characteristics of the amplifiers may deteriorate or the quantities of information (i.e., the numbers of bits, in the time domains $T_1, T_2, \ldots, T_n$) may be decreased.

The circuit of the present invention is free from such limitations.

Although AGC is achieved by causing the gain control signal to vary the input levels of IF signal amplifiers, in the foregoing description, it is also possible to achieve AGC by varying the feedback levels of the IF signal amplifiers. Further, although fourstage IF signal amplifiers are illustrated in the above described embodiment, the amplifiers may obviously have only one stage or more. Still further, although the foregoing description refers to a multi-direction time division multiplex communication system on the ground, the AGC circuits of this invention may also be used for satellite communication in a system known as the TDMA system, if the central station is regarded as a communication satellite.

What is claimed is:

1. An automatic gain control circuit for use in a receiver unit of a first station engaged in a time division multiplex radio communication system with a plurality of second stations dispersed in multiple directions, each of said second stations transmitting a burst signal during occurrences of individually associated time slots, said automatic gain control circuit comprising: first amplifier means responsive to gain control signals for amplifying to a predetermined amplitude each input burst signal transmitted from said plurality of second stations; means for branching output signals of said first amplifier means into a number of said input burst signals; means connected to outputs of said branching means for gating them responsive to occurrences of time slot signals respectively assigned to said input burst signals; means for detecting the amplitude level of each gated signal; a plurality of second amplifier means for respectively amplifying the outputs of said detecting means; and means responsive to time period signals corresponding to respective bursts of said input burst signals for supplying to said first amplifier means selected outputs of said plurality of second amplifier means as said gain control signal.

2. The automatic gain control circuit of claim 1 wherein said control signal supplying means includes means for gating each of the outputs of said plurality of second amplifier means responsive to the occurrence of each of said time slots; and variable resistor means connected to the outputs of said gating means for supplying said gain control signals.

3. The automatic gain control circuit of claim 1 wherein said control signal supplying means includes means for gating each of the outputs of said plurality of second amplifier means responsive to the occurrence of each of said time slots; means for arranging the output signals of said gating means in sequence; and a variable resistor means responsive to the output signal of said arranging means for supplying said gain control signals.

4. A method of controlling signal strength in a multi-direction time division multiplex radio communication system having a central station and a plurality of satellite stations which are dispersed in multiple directions with respect to said central station, said method comprising the steps of: (a) transmitting information pulse signals from said plurality of satellite stations to said central station via a common radio frequency in response to the occurrence of cyclically recurring time slot signals individually associated with said plurality of satellite stations; (b) receiving the transmitted information pulse signals at said central station; (c) amplifying the received information pulse signals; (d) separating and sending the amplified information pulse signals over a plurality of separate paths; (e) gating the separated information pulse signals over individual ones of said plurality of separate paths in response to occurrences of said time slot signals in order to produce gain control signals, each of said gain control signals being individually associated with a time slot assigned to a given satellite station; (f) amplifying said gain control signals; and (g) individually adjusting amplitudes of said received information pulse signals in response to the amplified gain control signals and the occurrences of said time slot signals to preclude variations in the amplitudes of said received information pulse signals.

* * * * *